United States Patent
Hamamura

(10) Patent No.: US 9,964,561 B2
(45) Date of Patent: May 8, 2018

(54) ACCELERATION SENSOR

(71) Applicant: Murata Manufacturing Co., Ltd., Nagaokakyo-shi, Kyoto-fu (JP)

(72) Inventor: Hiroshi Hamamura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 215 days.

(21) Appl. No.: 14/813,329

(22) Filed: Jul. 30, 2015

(65) Prior Publication Data

US 2015/0331010 A1 Nov. 19, 2015

Related U.S. Application Data

(63) Continuation of application No. PCT/JP2014/052921, filed on Feb. 7, 2014.

(30) Foreign Application Priority Data

Feb. 13, 2013 (JP) .................................. 2013-025131

(51) Int. Cl.
*G01P 15/12* (2006.01)
*G01P 15/18* (2013.01)
*B81B 3/00* (2006.01)
*H01L 29/84* (2006.01)

(52) U.S. Cl.
CPC .............. *G01P 15/123* (2013.01); *B81B 3/00* (2013.01); *G01P 15/12* (2013.01); *G01P 15/18* (2013.01); *H01L 29/84* (2013.01)

(58) Field of Classification Search
CPC ........ G01P 15/12; G01P 15/123; G01P 15/09; G01P 15/0922; G01P 2015/082; G01P 9/04; G01P 2015/0837; B81B 3/00

USPC ....................................................... 73/514.33
See application file for complete search history.

(56) References Cited

U.S. PATENT DOCUMENTS

| 5,005,413 | A | * | 4/1991 | Novack et al. ....... G01P 15/097 |
| | | | | 73/514.29 |
| 5,456,110 | A | | 10/1995 | Hulsing, II |
| 5,594,170 | A | * | 1/1997 | Peters ..................... G01P 1/003 |
| | | | | 73/514.29 |
| 6,122,965 | A | | 9/2000 | Seidel et al. |
| 2003/0229981 | A1 | * | 12/2003 | Mahon ............... G01P 15/0802 |
| | | | | 29/594 |
| 2011/0159627 | A1 | * | 6/2011 | Mantravadi et al. ................... B81C 1/00182 |
| | | | | 438/52 |

FOREIGN PATENT DOCUMENTS

| JP | 05-333052 A | 12/1993 |
| JP | 09-505396 A | 5/1997 |
| JP | 10-177033 A | 6/1998 |

(Continued)

OTHER PUBLICATIONS

Official Communication issued in International Patent Application No. PCT/JP2014/052921, dated May 13, 2014, 4 pages.

*Primary Examiner* — Lisa Caputo
*Assistant Examiner* — Roger Hernandez-Prewit
(74) *Attorney, Agent, or Firm* — Keating & Bennett, LLP

(57) ABSTRACT

An acceleration sensor includes weights, a support, and beams on which piezoresistive elements are disposed. The weights include projections and recesses. The support includes projections and recesses. The beams are connected to the projections and the recesses.

10 Claims, 9 Drawing Sheets

(56) References Cited

FOREIGN PATENT DOCUMENTS

| JP | 2004-340858 A | 12/2004 |
|----|---------------|---------|
| JP | 2008-164365 A | 7/2008 |
| WO | 2005/062060 A1 | 7/2005 |
| WO | 2013/089079 A1 | 6/2013 |

* cited by examiner

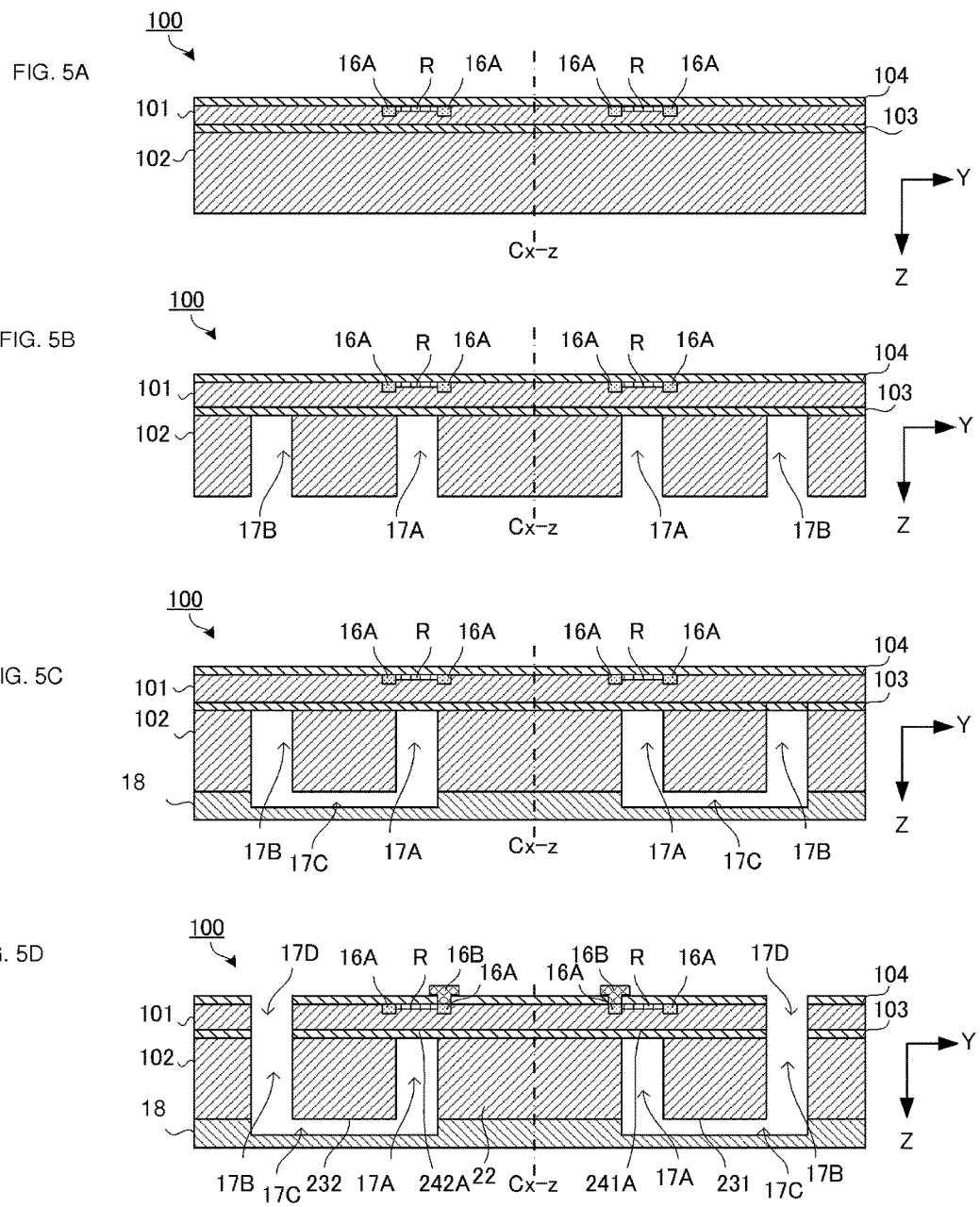

ACCELERATION SENSOR

BACKGROUND OF THE INVENTION

1. Field of the Invention

The present invention relates to an acceleration sensor including a piezoresistive element.

2. Description of the Related Art

An example of an acceleration sensor including a piezoresistive element is an acceleration sensor that detects an acceleration in the direction of the thickness of the acceleration sensor and an acceleration in the direction of a plane of the acceleration sensor disclosed in International Publication No. WO 2005/062060 or Japanese Unexamined Patent Application Publication No. 2004-340858.

FIG. 9A is a plan view of an acceleration sensor 1P based on International Publication No. WO 2005/062060. The acceleration sensor 1P includes a support frame 2P, a weight 3P, four flexible arms (beams) 41P, 42P, 43P, and 44P, an X-axis detection piezoresistor 51P, a Y-axis detection piezoresistor 52P, and a Z-axis detection piezoresistor 53P. The support frame 2P has a rectangular frame shape. The weight 3P is arranged inside the support frame 2P. The four flexible arms 41P, 42P, 43P, and 44P are arranged in a cross shape around the weight 3P, and each of them is connected between the weight 3P and the center of the corresponding side of the support frame 2P. The X-axis detection piezoresistor 51P is disposed on the flexible arms 42P and 44P. The Y-axis detection piezoresistor 52P is disposed on the flexible arms 41P and 43P. The Z-axis detection piezoresistor 53P is disposed on the flexible arms 42P and 44P.

FIG. 9B is a plan view of an acceleration sensor 1Q based on Japanese Unexamined Patent Application Publication No. 2004-340858. The acceleration sensor 1Q includes a semiconductor substrate 2Q, a weight 3Q, a beam portion 4Q, a Z-axis detection piezoresistor 51Q, and an X-axis detection piezoresistor 52Q. The semiconductor substrate 2Q has a rectangular frame shape. The weight 3Q is arranged inside the frame of the semiconductor substrate 2Q. The beam portion 4Q extends along the Y axis and is connected to the semiconductor substrate 2Q and the weight 3Q. The beam portion 4Q includes a surface 41Q orthogonal to the Z axis and parallel to the X axis and Y axis and an oblique surface 42Q that is not orthogonal to the Z axis or X axis and that is parallel to the Y axis. The X-axis detection piezoresistor 52Q is disposed on the oblique surface 42Q and detects an acceleration in a direction along the X axis. The Z axis detection piezoresistor 51Q is disposed on the surface 41Q and detects an acceleration in a direction along the Z axis.

The acceleration sensor disclosed in Japanese Unexamined Patent Application Publication No. 2004-340858 needs the oblique surface 42Q in the beam portion and the X-axis detection piezoresistor 52Q on the oblique surface 42Q. In order to dispose the oblique surface 42Q in the beam portion and the X-axis detection piezoresistor 52Q on the oblique surface 42Q, sophisticated process techniques are required, and this is a factor for unstable qualities of acceleration sensors.

If the plurality of flexible beams fixed on different positions in the acceleration sensor disclosed in International Publication No. WO 2005/062060 are bent in response to the effects of external stresses, although it is in a state where a desired acceleration is not exerted thereon, an unnecessary detection signal may be output. Additionally, both of the acceleration sensors disclosed in International Publication No. WO 2005/062060 or Japanese Unexamined Patent Application Publication No. 2004-340858 have a problem in that a widened detection range causes a reduction in detection sensitivity.

SUMMARY OF THE INVENTION

Accordingly, preferred embodiments of the present invention provide an acceleration sensor that is easily manufactured, that does not output unnecessary detection signals in response to external stresses, and that achieves a wide detection range and high detection sensitivity.

An acceleration sensor according to a preferred embodiment of the present invention includes a weight, a support facing the weight, a plurality of beams connecting the weight and the support, and a piezoresistive element disposed on at least one of the plurality of beams. The weight includes a weight-side projection projecting toward the support. The support includes a support-side projection situated away from a location that faces the weight-side projection and projecting toward the weight. One of the plurality of beams includes a first end portion connected to the weight-side projection and a second end portion connected to a portion of the support, the portion facing the weight-side projection. Another one of the plurality of beams includes a first end portion connected to the support-side projection and a second end portion connected to a portion of the weight, the portion facing the support-side projection.

In this configuration, each of the weight and the support includes a projection, the beams are disposed with a difference in level, and thus each of the beams has a region where a stress is locally focused when the weight is displaced. Accordingly, disposing the piezoresistive elements in the regions in which the stresses is focused enables the acceleration sensor to achieve high sensitivity even with a wide range.

An acceleration sensor according to a preferred embodiment of the present invention includes a first weight, a second weight symmetrical to the first weight about a plane, a support arranged between the first weight and the second weight, a first beam connecting the first weight and the support, a second beam symmetrical to the first beam about a plane and connecting the second weight and the support, a third beam connecting the first weight and the support, a fourth beam symmetrical to the third beam about a plane and connecting the second weight and the support, and a piezoresistive element disposed on at least one of the first beam and the third beam and a piezoresistive element disposed on at least one of the second beam and the fourth beam. The first weight includes a first projection projecting toward the support. The second weight includes a second projection projecting toward the support. The support includes a third projection situated away from a location that faces the first projection and projecting toward the first weight and a fourth projection situated away from a location that faces the second projection and projecting toward the second weight. The first beam includes a first end portion connected to the first projection and a second end portion connected to a portion of the support, the portion facing the first projection. The second beam includes a first end portion connected to the second projection and a second end portion connected to a portion of the support, the portion facing the second projection. The third beam includes a first end portion connected to the third projection and a second end portion connected to a portion of the first weight, the portion facing the third projection. The fourth beam includes a first end portion connected to the fourth projection and a second end portion connected to a portion of the second weight, the portion facing the fourth projection.

In this configuration, the first beam and the third beam, which support the first weight, and the second beam and the fourth beam, which support the second weight, extend in mutually opposite directions from the support. Thus, the first weight and the second weight exhibit behaviors in the opposite directions to accelerations along the mutually facing directions and exhibit the same behavior to accelerations in a direction perpendicular to the directions. Therefore, detecting the behavior of the first weight and the behavior of the second weight by using the respective piezoresistive elements disposed on them enables detection of accelerations in various directions without using a configuration that requires sophisticated process techniques in manufacturing. In addition, the acceleration sensor is not easily affected by the effects of external stresses applied to the support and unnecessary vibrations and noise and does not substantially output unnecessary detection signals. Moreover, because each of the first weight, the second weight, and the support includes a projection and the beams are disposed with a difference in level, each beam has a region in which a stress is locally focused when the first weight and the second weight are displaced. Accordingly, disposing the piezoresistive elements in the regions where the stresses are focused enables the acceleration sensor to achieve higher sensitivity even with a wide range.

In an acceleration sensor according to a preferred embodiment of the present invention, the support may extend along a direction that faces the weight and along a direction perpendicular to a direction in which the plurality of beams are arranged, and the support may be fixed on an external structure at only one end portion of both end portions in the extending directions as a fixed end.

This configuration significantly reduces or prevents outputs of unnecessary detection signals in response to external stresses.

In an acceleration sensor according to a preferred embodiment of the present invention, a size of the support in a cross section perpendicular to the direction in which the support extends may be locally small in a vicinity of the fixed end.

This configuration significantly reduces or prevents transmission of external stresses to the support through the fixed end and further reduce outputs of unnecessary detection signals.

In an acceleration sensor according to a preferred embodiment of the present invention, a tip of the first projection may be positioned on a side where the first weight is disposed with respect to a tip of the third projection, and a tip of the second projection may be positioned on a side where the second weight is disposed with respect to a tip of the fourth projection.

In this configuration, the projections in the first weight, the second weight, and in the support are disposed such that they do not enter the opposed side. Each beam has a region in which a stress is focused between a location adjacent to the center of the beam and a location adjacent to one end portion of the beam. Accordingly, disposing the piezoresistive elements in the regions in which the stresses are focused enables the acceleration sensor to achieve high sensitivity even with a wide range.

In an acceleration sensor according to a preferred embodiment of the present invention, a tip of the first projection may be positioned on a side where the support is disposed with respect to a tip of the third projection, and a tip of the second projection may be positioned on a side where the support is disposed with respect to a tip of the fourth projection.

In this configuration, the projections in the first weight and the second weight and the projections in the support enter the opposed side. Thus, both end portions of each beam include regions in which a stress is focused. Accordingly, disposing the piezoresistive elements in the regions in which the stresses are focused enables the acceleration sensor to achieve high sensitivity even with a wide range.

According to various preferred embodiments of the present invention, the detection sensitivity is not easily decreased by a widened detection range. The acceleration sensor that is able to be easily manufactured is provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 5A-5D includes cross-sectional views for describing a method for manufacturing the acceleration sensor according to the first preferred embodiment of the present invention.

DETAILED DESCRIPTION OF THE PREFERRED EMBODIMENTS

First Preferred Embodiment

Figure 1:
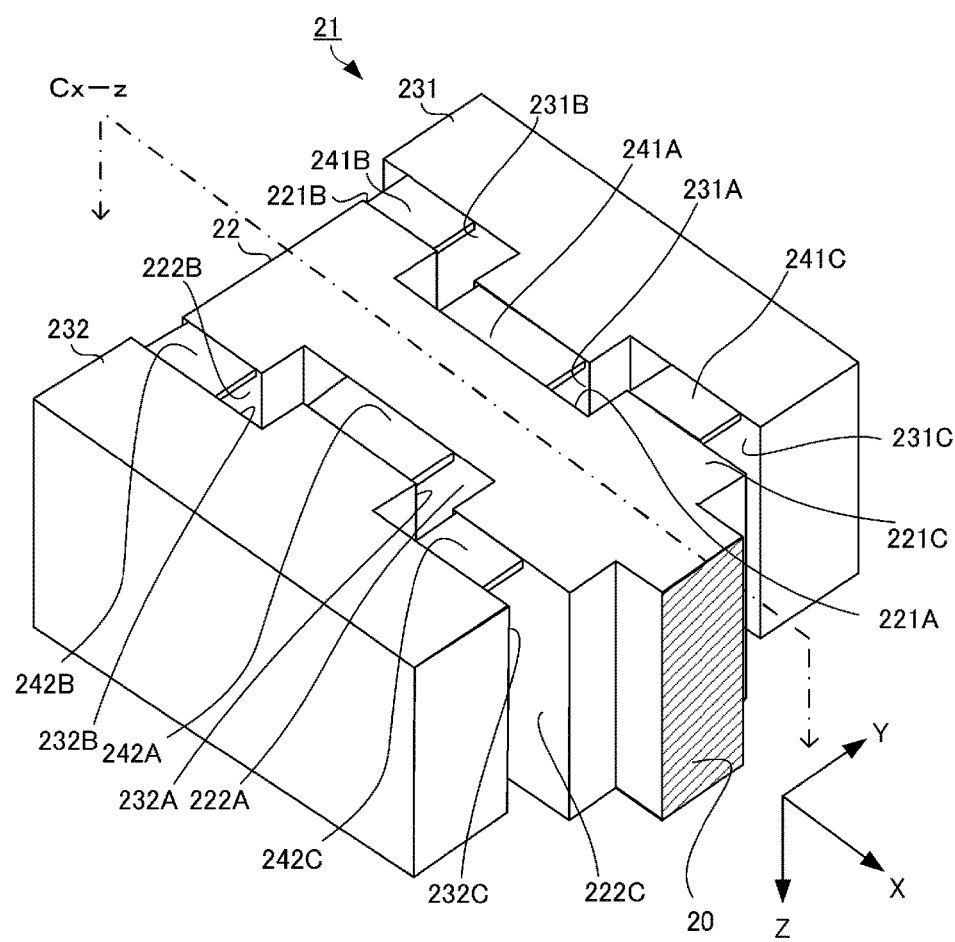
FIG. 1 is a perspective view of an acceleration sensor according to a first preferred embodiment of the present invention.

Next, an acceleration sensor according to a first preferred embodiment of the present invention is described based on FIGS. 1 to 6. The acceleration sensor described here is capable of detecting accelerations in two axial directions, for example. In the drawings, a Z axis, which is a first detection axis extending along the direction of the thickness of the acceleration sensor, a Y axis, which is a second detection axis extending along the direction of a plane of the acceleration sensor and is perpendicular to the Z axis, and an X axis, which is perpendicular to the Z axis and Y axis, are indicated. In the drawings, a Cx-z plane, which is parallel to the X axis and the Z axis and perpendicular to the Y axis, is indicated as a central plane that passes through the center of the acceleration sensor.

Figure 2A:
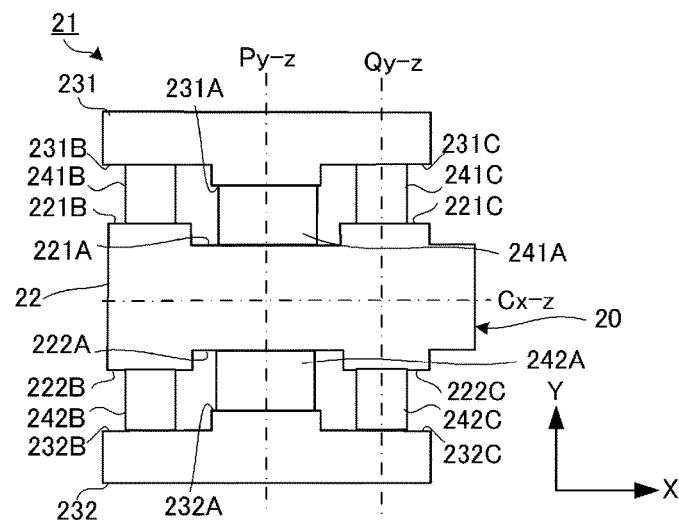
FIGS. 2A-2C are plan view and cross-sectional views of the acceleration sensor according to the first preferred embodiment of the present invention.
Figure 2B:
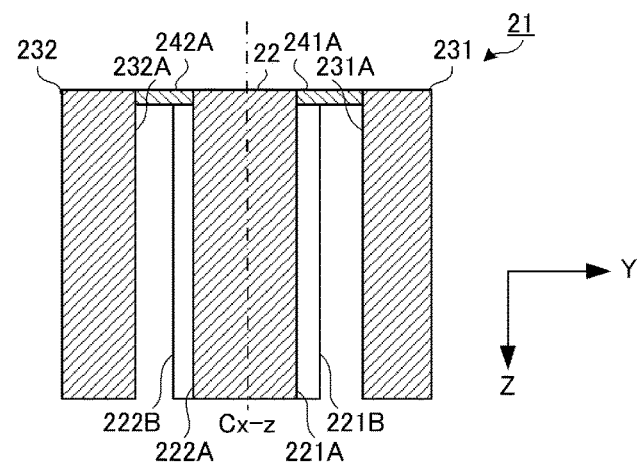
Figure 2C:
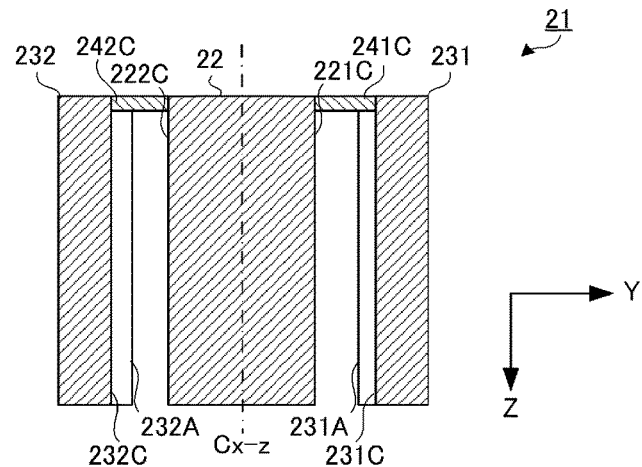

FIG. 1 is a perspective view of an acceleration sensor 21 according to the first preferred embodiment of the present invention. FIG. 2A is a plan view of the X-Y plane of the acceleration sensor 21. FIG. 2B is a cross-sectional view of the Y-Z plane of the acceleration sensor 21 at a Py-z plane illustrated in FIG. 2A. FIG. 2C is a cross-sectional view of the Y-Z plane of the acceleration sensor 21 at a Qy-z plane illustrated in FIG. 2A. The Py-z plane and Qy-z plane are parallel to the Y axis and Z axis and perpendicular to the X axis.

The acceleration sensor 21 preferably is a micro-electro-mechanical systems (MEMS) piezoresistive acceleration sensor formed by micromachining, which is described below, such as etching, on a silicon on insulator (SOI) substrate, for example.

The acceleration sensor 21 is symmetrical about a Cx-z plane. More specifically, the acceleration sensor 21 includes a first weight 231, a second weight 232, a support 22, a first beam 241A, a second beam 242A, third beams 241B and 241C, fourth beams 242B and 242C, and an acceleration detecting circuit (not illustrated).

The first weight 231 and the second weight 232 are symmetrical about the Cx-z plane and face each other in the Y-axis direction. The support 22 is arranged between the first weight 231 and the second weight 232. The support 22 extends along the X-axis and includes a first end and a second end in the X-axis direction. The first end floats from an external structure. The second end, which is indicated by oblique lines in FIG. 1, is fixed on the external structure as a fixed end 20. The size of the support 22 at a cross section perpendicular to the X axis in the vicinity of the fixed end 20 is locally small. Thus, if a stress tries to be transmitted from the external structure to the fixed end 20, the stress is not easily transmitted from the fixed end 20 to the support 22. The first beam 241A and the third beams 241B and 241C connect the first weight 231 and the support 22. The second beam 242A and the fourth beams 242B and 242C connect the second weight 232 and the support 22. The first beam 241A and the second beam 242A are symmetrical about the Cx-z plane. The third beam 241B and the fourth beam 242B are symmetrical about the Cx-z plane. The third beam 241C and the fourth beam 242C are symmetrical about the Cx-z plane.

More specifically, the first weight 231 has a projecting shape in which a center of a surface that faces the support 22 on a negative Y-axis direction side projects toward the support 22 (toward the negative Y-axis direction) as seen in the X-Y plane illustrated in FIG. 2A. In other words, the first weight 231 includes a first projection 231A, a recess 231B, and a recess 231C. The first projection 231A is a region that includes a portion projecting toward the support 22. The recess 231B is a region extending in a negative X-axis direction with respect to the first projection 231A. The recess 231C is a region extending a positive X-axis direction with respect to the first projection 231A.

The second weight 232 has a projecting shape in which a center of a surface that faces the support 22 in a positive Y-axis direction projects toward the support 22 (toward the positive Y-axis direction). In other words, the second weight 232 includes a second projection 232A, a recess 232B, and a recess 232C as seen in the X-Y plane illustrated in FIG. 2A. The second projection 232A is a region that includes a portion projecting toward the support 22. The recess 232B is a region extending in the negative X-axis direction with respect to the second projection 232A. The recess 232C is a region extending the positive X-axis direction with respect to the second projection 232A.

Each of the first weight 231 and the second weight 232 has an oblong or substantially oblong shape with short sides parallel to the Y axis and long sides parallel to the Z axis as seen in a Y-Z plane illustrated in FIGS. 2B and 2C.

The support 22 has an H shape in which a center of a surface that faces the first weight 231 on the positive Y-axis direction side is recessed in a direction opposite to the first weight 231 (in the negative Y-axis direction) and a center of a surface that faces the second weight 232 on the negative Y-axis direction side is recessed in a direction opposite to the second weight 232 (in the positive Y-axis direction) as seen in the X-Y plane illustrated in FIG. 2A.

In other words, the support 22 includes a recess 221A and third projections 221B and 221C on the side facing the first weight 231. The recess 221A is a region that includes a portion recessed in the direction opposite to the first weight 231. Each of the third projections 221B and 221C is a region extending in the negative X-axis direction or positive X-axis direction with respect to the recess 221A. The third projection 221B is the region extending in the negative X-axis direction with respect to the recess 221A. The third projection 221C is the region extending in the positive X-axis direction with respect to the recess 221A.

The support 22 includes a recess 222A and fourth projections 222B and 222C on the side facing the second weight 232. The recess 222A is a region that includes a portion recessed in the direction opposite to the second weight 232. Each of the fourth projections 222B and 222C is a region extending in the negative X-axis direction or positive X-axis direction with respect to the recess 222A. The fourth projection 222B is the region extending in the negative X-axis direction with respect to the recess 222A. The fourth projection 222C is the region extending in the positive X-axis direction with respect to the recess 222A.

The support 22 has an oblong or substantially oblong shape with short sides parallel to the Y axis and long sides parallel to the Z axis as seen in the Y-Z plane illustrated in FIGS. 2B and 2C.

The first projection 231A has a width shorter than that of the recess 221A in the support 22 in the X-axis direction and faces an approximately intermediate portion in the recess 221A in the X-axis direction. The second projection 232A has a width shorter than that of the recess 222A in the support in the X-axis direction and faces an approximately intermediate portion in the recess 222A in the X-axis direction. The third projections 221B and 221C have widths shorter than those of the recesses 231B and 231C in the first weight 231 in the X-axis direction and face approximately intermediate portions in the X-axis direction in the recesses 231B and 231C in the first weight 231, respectively. The fourth projections 222B and 222C have widths shorter than those of the recesses 232B and 232C in the second weight 232 in the X-axis direction and face approximately intermediate portions in the X-axis direction in the recesses 232B and 232C in the second weight 232, respectively.

The first weight 231, the second weight 232, and the support 22 are configured such that their projections and recesses do not enter the opposed side. In other words, the tip of the first projection 231A in the first weight 231 in the negative Y-axis direction is positioned on the positive Y-axis direction side, that is, on the side where the first weight 231 is disposed with respect to the tip of each of the third projections 221B and 221C in the support 22 in the positive Y-axis direction. The tip of the second projection 232A in the second weight 232 in the positive Y-axis direction is positioned on the negative Y-axis direction side, that is, on the side where the second weight 232 is disposed with respect to the tip of each of the fourth projections 222B and 222C in the support 22 in the negative Y-axis direction.

Each of the first beam 241A, the second beam 242A, the third beams 241B and 241C, and the fourth beams 242B and 242C has a planar shape flexible in the Z-axis direction and extends along the Y-axis direction.

More specifically, the first beam 241A has an end portion in the negative Y-axis direction connected to the recess 221A in the support 22 and an end portion in the positive Y-axis direction connected to the first projection 231A in the first weight 231. The third beam 241B has an end portion in the negative Y-axis direction connected to the third projection 221B in the support 22 and an end portion in the positive Y-axis direction connected to the recess 231B in the first weight 231. The third beam 241C has an end portion in the negative Y-axis direction connected to the third projection 221C in the support 22 and an end portion in the positive Y-axis direction connected to the recess 231C in the first weight 231. The second beam 242A has an end portion in the positive Y-axis direction connected to the recess 222A in the support 22 and an end portion in the negative Y-axis direction connected to the second projection 232A in the second weight 232. The fourth beam 242B has an end portion in the positive Y-axis direction connected to the fourth projection 222B in the support 22 and an end portion in the negative Y-axis direction connected to the recess 232B in the second weight 232. The fourth beam 242C has an end portion in the positive Y-axis direction connected to the fourth projection 222C in the support 22 and an end portion in the negative Y-axis direction connected to the recess 232C in the second weight 232.

Figure 9A:
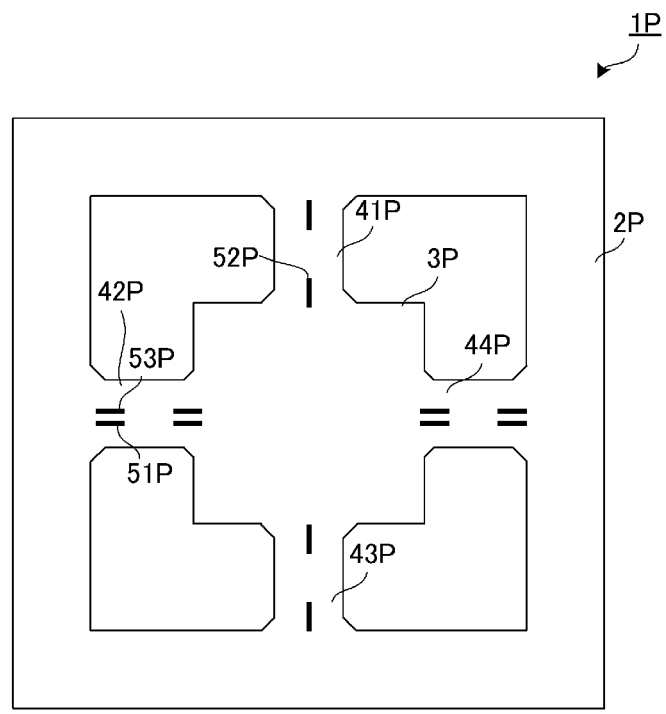
FIGS. 9A and 9B are plan views for describing a known example acceleration sensor.
Figure 9B:
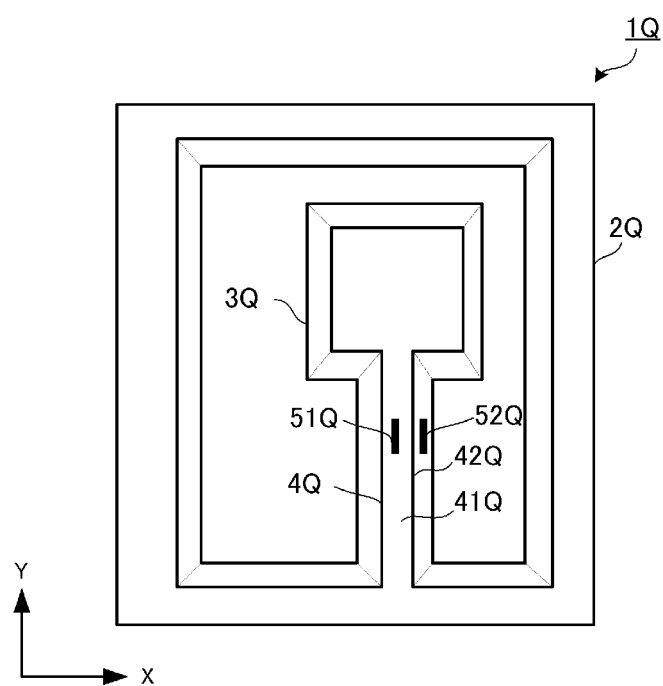

In the acceleration sensor 21 having the above-described configuration, the first weight 231 is supported by the support 22 in a cantilever manner through the first beam 241A and the third beams 241B and 241C, and the second weight 232 is supported by the support 22 in a cantilever manner through the second beam 242A and the fourth beams 242B and 242C. The first weight 231, the first beam 241A, the third beams 241B and 241C are symmetrical to the second weight 232, the second beam 242A, and the fourth beams 242B and 242C about the Cx-z plane. Accordingly, the acceleration sensor 21 is not easily affected by the effects of external stresses, unnecessary vibrations, and the like. In addition, the acceleration sensor 21 achieves a wide detection range and high detection sensitivity. The first beam 241A, the second beam 242A, the third beams 241B and 241C, and the fourth beams 242B and 242C do not need including an oblique surface or a piezoresistive element on the oblique surface, unlike the configuration illustrated in FIG. 9B as a known configuration, and thus it can be easily manufactured.

Next, vibration behavior of the acceleration sensor 21 according to the first preferred embodiment of the present invention is described.

Figure 3A:
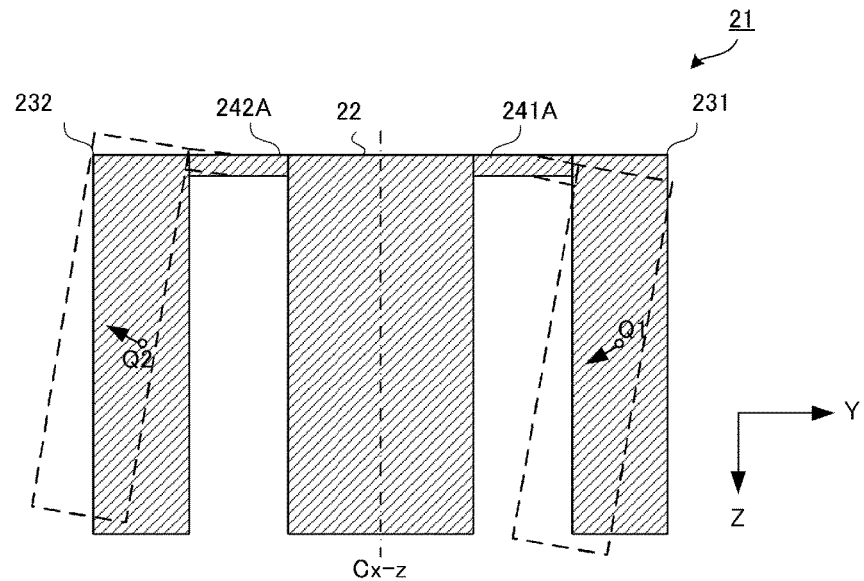
FIGS. 3A and 3B are cross-sectional views for describing displacement behavior of weights in the acceleration sensor according to the first preferred embodiment of the present invention.
Figure 3B:
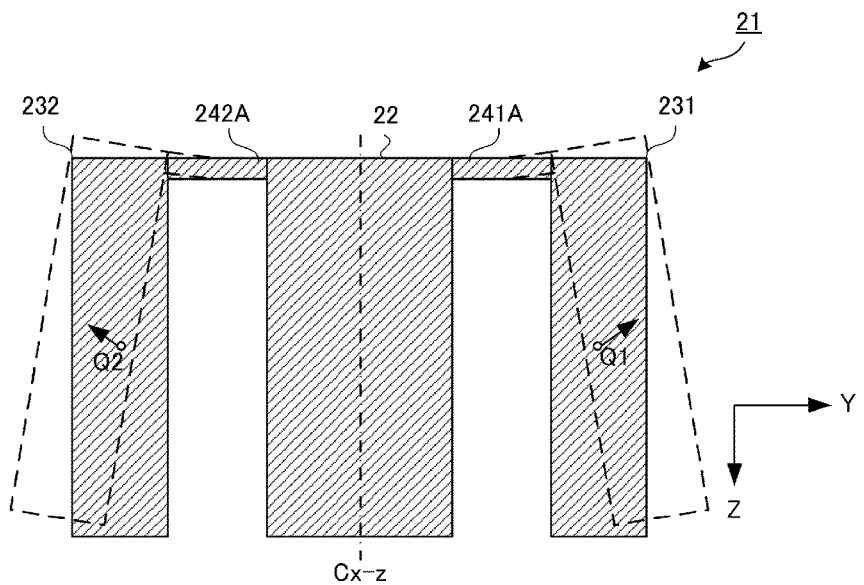

FIG. 3 includes cross-sectional views of the Y-Z plane of the acceleration sensor 21 at the Py-z plane, similar to FIG. 2B. FIG. 3A illustrates behavior when an acceleration in a direction along the Y axis is exerted on the acceleration sensor 21. FIG. 3B illustrates behavior when an acceleration in a direction along the Z axis is exerted on the acceleration sensor 21.

In the state illustrated in FIG. 3A, the acceleration in the direction along the Y axis (positive Y-axis direction) is exerted on the acceleration sensor 21. In this state, an inertial force acts on the first weight 231 and the second weight 232 in a direction opposite to the direction in which the acceleration is exerted (negative Y-axis direction), and they are displaced within the Y-Z plane. At this time, the displacement of the first weight 231 and that of the second weight 232 are opposite to each other with respect to the support.

In the state illustrated in FIG. 3B, the acceleration in the direction along the Z axis (positive Z-axis direction) is exerted on the acceleration sensor 21. In this state, an inertial force acts on the first weight 231 and the second weight 232 in a direction opposite to the direction in which the acceleration is exerted (negative Z-axis direction), and they are displaced within the Y-Z plane. The first weight 231 and the second weight 232 are displaced in the same direction with respect to the support.

Accordingly, when an acceleration in a direction in the Y-Z plane is exerted on the acceleration sensor 21, the first weight 231 and the second weight 232 are displaced within the Y-Z plane. The displacement behavior of the first weight 231 and that of the second weight 232 are different, depending on the direction of the acceleration. Thus, detecting the displacement behaviors of the first weight 231 and the second weight 232 enables detecting accelerations in various directions in the cross section at the Y-Z plane.

Next, an example arrangement of piezoresistive elements in the acceleration sensor 21 is described.

Figure 4:
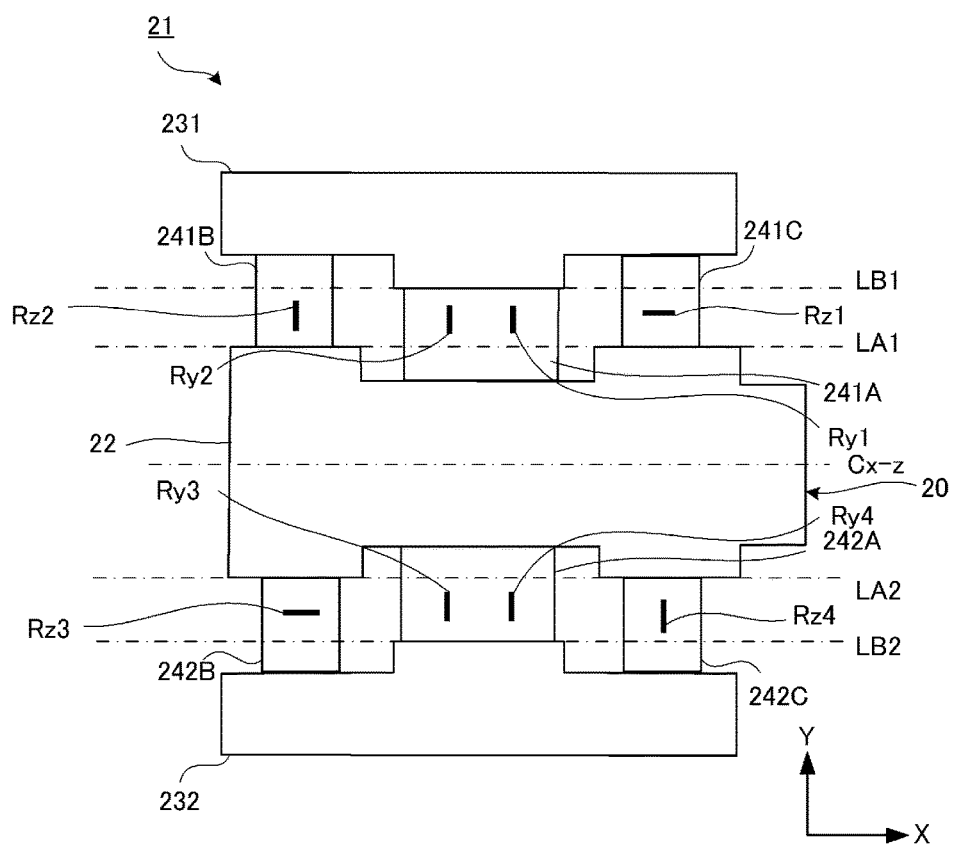
FIG. 4 is a plan view for describing behavior of the acceleration sensor according to the first preferred embodiment of the present invention and an example arrangement of piezoresistive elements.

FIG. 4 is a plan view of the acceleration sensor 21. In FIG. 4, straight lines LB1, LA1, LB2, and LA2 are illustrated. The straight line LB1 passes through an end portion of the first beam 241A in the positive Y-axis direction and is parallel to the X axis. The straight line LA1 passes through an end portion of each of the third beams 241B and 241C in the negative Y-axis direction and is parallel to the X axis. The straight line LB2 passes through an end portion of the second beam 242A in the negative Y-axis direction and is parallel to the X axis. The straight line LA2 passes through an end portion of each of the fourth beams 242B and 242C in the positive Y-axis direction and is parallel to the X axis. In a region between the straight lines LA1 and LB1, the first beam 241A and the third beams 241B and 241C overlap each other in the X-axis direction. In a region between the straight lines LA2 and LB2, the first beam 241A and the third beams 241B and 241C overlap each other in the X-axis direction.

In the acceleration sensor 21, the first weight 231 and the support 22 have the structures of projections and recesses in which their respective facing surfaces engage with each other, but they do not enter the opposed side. Thus, the position where the first weight 231 is supported by the first beam 241A on the Y axis is situated away from the positions where the first weight 231 is supported by the third beams 241B and 241C on the Y axis. The position where the first beam 241A is supported by the support 22 on the Y axis is situated away from the positions where the third beams 241B and 241C are supported by the support 22 on the Y axis.

In the acceleration sensor 21, the second weight 232 and the support 22 have the structures of projections and recesses in which their respective facing surfaces engage with each other, but they do not enter the opposed side, as in the case of the first weight 231 and the support 22. Thus, the position where the second weight 232 is supported by the second beam 242A on the Y axis is situated away from the positions where the second weight 232 is supported by the fourth beams 242B and 242C on the Y axis. The position where the second beam 242A is supported by the support 22 on the Y axis is situated away from the positions where the fourth beams 242B and 242C are supported by the support 22 on the Y axis.

Accordingly, a stress is locally focused on the portions of the first beam 241A and the third beams 241B and 241C between the straight lines LA1 and LB1 and the portions of the second beam 242A and the fourth beams 242B and 242C between the straight lines LA2 and LB2, and thus the exerted stress is large.

The acceleration detecting circuit (not illustrated) includes piezoresistive elements Ry1, Ry2, Ry3, Ry4, Rz1, Rz2, Rz3, and Rz4 in the regions of the first beam 241A, the second beam 242A, the third beams 241B and 241C, and the fourth beams 242B and 242C where the stress is exerted. The piezoresistive elements Ry1, Ry2, Ry3, and Ry4 are arranged such that they produce outputs for an acceleration along the Y axis. The piezoresistive elements Rz1, Rz2, Rz3, and Rz4 are arranged such that they produce outputs for an acceleration along the Z axis.

When there is a detection axis in which an acceleration is desired to be detected with higher sensitivity, a beam on which a piezoresistive element corresponding to that detection axis is disposed may preferably have a narrower width. In the acceleration sensor 21 illustrated in FIG. 4, the first beam 241A and the second beam 242A are beams having wide widths, whereas the third beams 241B and 241C and the fourth beams 242B and 242C are beams having narrow widths. The piezoresistive elements Ry1, Ry2, Ry3, and Ry4, whose detection axis is the Y axis, are disposed on the thick first beam 241A and second beam 242A. The piezoresistive elements Rz1, Rz2, Rz3, and Rz4, whose detection axis is the Z axis, are disposed on the thin third beams 241B and 241C and fourth beams 242B and 242C. Thus, the acceleration sensor 21 detects an acceleration along the Z axis with high sensitivity.

Next, a non-limiting example of a method for manufacturing the acceleration sensor 21 according to the first preferred embodiment of the present invention is described. FIG. 5 includes cross-sectional views of a Y-Z plane for describing the method for manufacturing the acceleration sensor 21 according to the first preferred embodiment of the present invention. With the manufacturing method illustrated in FIG. 5, an apparatus including the acceleration sensor 21 is manufactured. The cross-sectional views of the Y-Z plane illustrated in FIG. 5 correspond to the cross-sectional view of the Y-Z plane illustrated in FIG. 2B, which is described above. In the following description, a piezoresistive element R is used as a representative of the piezoresistive elements Ry1, Ry2, Ry3, Ry4, Rz1, Rz2, Rz3, and Rz4.

First, as illustrated in FIG. 5A, an SOI substrate 100 is prepared. The SOI substrate 100 includes a silicon substrate 101, a silicon substrate 102, and an insulation layer 103 disposed therebetween. The insulation layer 103 may be made of $SiO_2$ or SiN, for example. In the present preferred embodiment, an insulation layer 104 is disposed on the surface of the silicon substrate 101.

Next, piezoresistive elements R (p+ layers) are formed on the front side of the silicon substrate 101 by using a photolithography technique and an ion implantation technique. Then, low-resistance wiring regions 16A (p++ layers) are formed on the front side of the silicon substrate 101 by using the photolithography technique and the ion implantation technique.

Next, as illustrated in FIG. 5B, dry etching using fluorine gas (e.g., $CF_4$, $C_4F_8$, $SF_6$) or chlorine gas ($Cl_2$) is performed from the back side of the SOI substrate 100 (side on which the silicon substrate 102 is disposed) by using the photolithography technique and an etching technique. This forms spaces 17A, which will become spaces between the support 22 and each of the first weight 231 and the second weight 232, and spaces 17B, which will become spaces allowing each of the first weight 231 and the second weight 232 to be displaced. Subsequently, as illustrated in FIG. 5C, a cover material 18 is joined to the back side of the SOI substrate 100 (side on which the silicon substrate 102 is disposed). The cover material 18 has spaces 17C communicating with the spaces 17A and 17B.

Next, as illustrated in FIG. 5D, spaces 17D communicating with the spaces 17B are formed by dry etching performed from the front side of the SOI substrate 100 (side on which the insulation layer 104 is disposed) by using the photolithography technique and the etching technique. Wiring electrode patterns 16B are formed on the front side of the insulation layer 104, that is, on the front side of the SOI substrate 100. The wiring electrode patterns 16B are formed so as to be connected to the low-resistance wiring regions 16A on the silicon substrate 101. After that, a portion of the insulation layer 104, the silicon substrate 101, and the insulation layer 103 is removed from the front side of the SOI substrate 100 by dry etching such that portions corresponding to the first weight 231, the second weight 232, the support 22, the first beam 241A, the third beams 241B and 241C, the second beam 242A, and the fourth beams 242B and 242C remain. Through this process, the structure in which the first weight 231 and the second weight 232 are supported while being allowed to be displaced is achieved.

As described above, the acceleration sensor according to a preferred embodiment of the present invention is implemented. In the present preferred embodiment, an example of the acceleration sensor in which weights and beams are disposed on both sides of the support is illustrated. The acceleration sensor may have a configuration in which a weight and a beam are disposed on only one side of the support.

First Variations

Next, first variations of the acceleration sensor according to the first preferred embodiment are described. The acceleration sensors according to the first variations differ from the acceleration sensor illustrated in FIG. 4 in the arrangement of the piezoresistive elements.

Figure 6A:
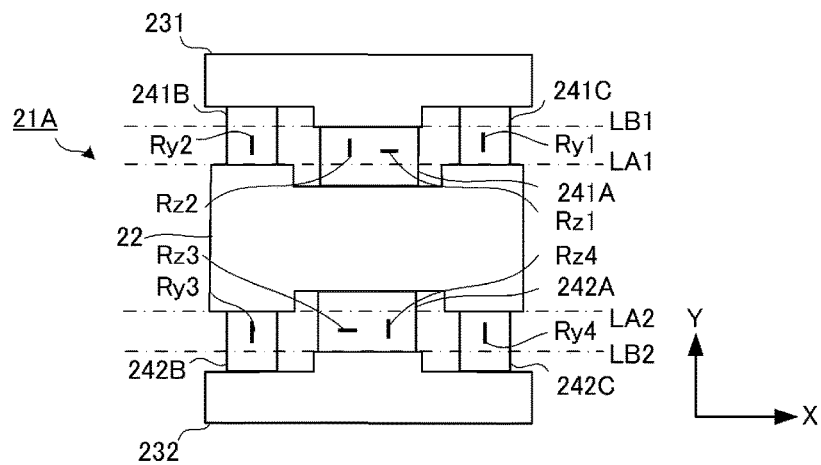
FIGS. 6A-6C are plan views of first variations of the acceleration sensor according to the first preferred embodiment of the present invention.
Figure 6B:
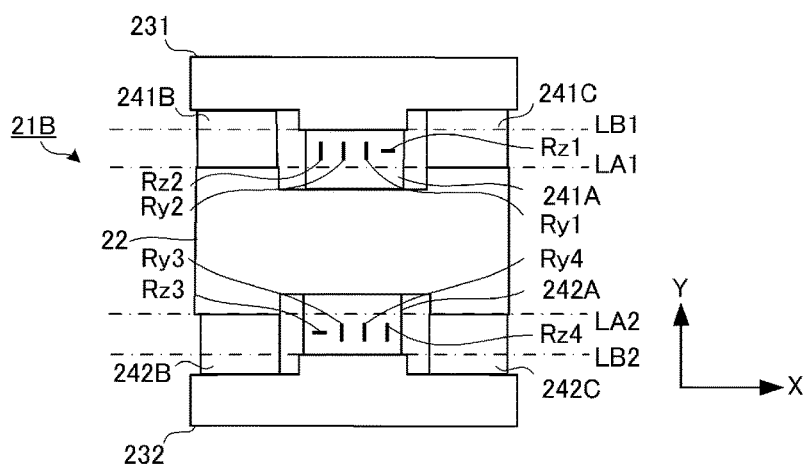
Figure 6C:
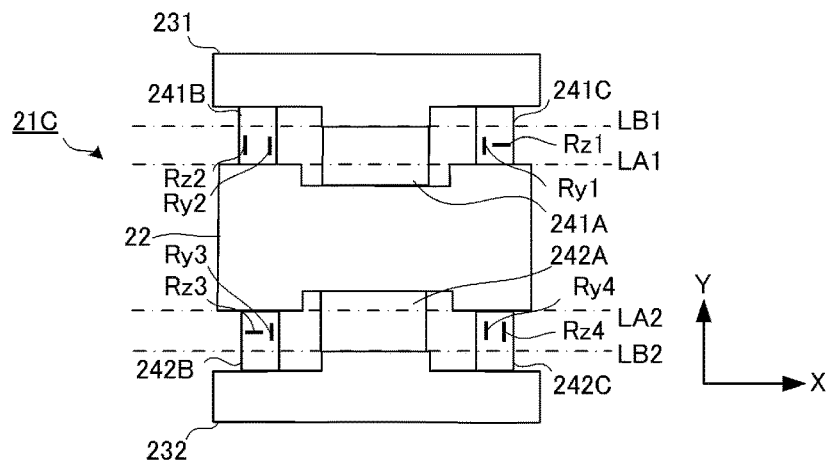

FIG. 6A is a plan view of an acceleration sensor 21A having a different arrangement of the piezoresistive elements. FIG. 6B is a plan view of an acceleration sensor 21B having another different arrangement of the piezoresistive elements. FIG. 6C is a plan view of an acceleration sensor 21C having still another different arrangement of the piezoresistive elements. As illustrated in the acceleration sensors 21A, 21B, and 21C, the piezoresistive elements are able to be disposed on any beams. The arrangement of the piezoresistive elements may preferably be set in accordance with the width of each beam in the X-axis direction.

Second Variations

Next, second variations of the acceleration sensor according to the first preferred embodiment are described. The acceleration sensors according to the second variations differ from the acceleration sensor illustrated in FIG. 4 in the depths of the structures of the projections and recesses of the facing surfaces of the support and the first weight and the second weight or their arrangement.

Figure 7A:
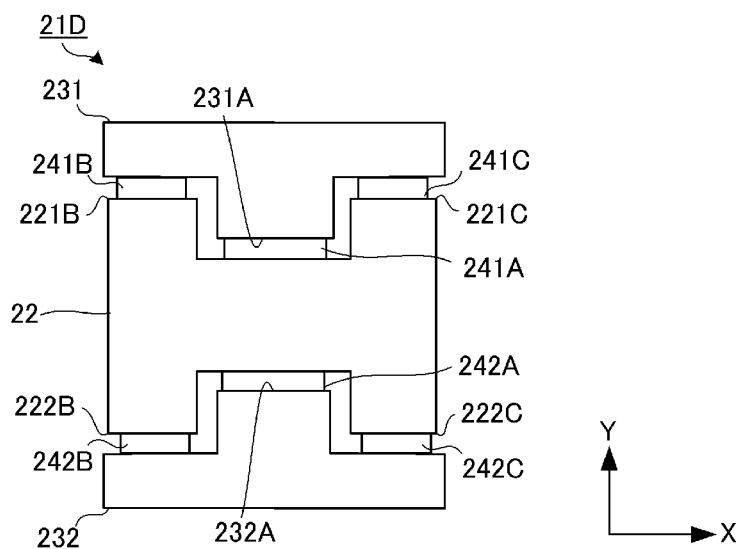
FIGS. 7A and 7B are plan views of second variations of the acceleration sensor according to the first preferred embodiment of the present invention.

FIG. 7A is a plan view of an acceleration sensor 21D having different depths of the structures of the projections and recesses of the facing surfaces of the support and the first weight and the second weight.

In the acceleration sensor 21D, the depths of the structures of the projections and recesses are larger than those in the configuration illustrated in FIG. 4. The projection structure of the first weight 231 enters the recess structure of the support 22 such that the first projection 231A in the first weight 231 and each of the third projections 221B and 221C in the support 22 face each other in the X-axis direction. The projection structure of the second weight 232 enters the recess structure of the support 22 such that the second projection 232A in the second weight 232 and each of the fourth projections 222B and 222C in the support 22 face each other in the X-axis direction.

In other words, in the acceleration sensor 21D, the tip of the first projection 231A in the first weight 231 in the negative Y-axis direction is positioned on the negative Y-axis direction side, that is, on the side where the support 22 is disposed with respect to the tip of each of the third projections 221B and 221C in the support 22 in the positive Y-axis direction. The tip of the second projection 232A in the second weight 232 in the positive Y-axis direction is positioned on the positive Y-axis direction side, that is, on the side where the support 22 is disposed with respect to the tip of each of the fourth projections 222B and 222C in the support 22 in the negative Y-axis direction. The tip of the third projections 221B and 221C in the support 22 in the positive Y-axis direction is positioned on the positive Y-axis direction side, that is, on the side where the first weight 231 is disposed with respect to the tip of the first projection 231A in the first weight 231 in the negative Y-axis direction. The tip of each of the fourth projections 222B and 222C in the support 22 in the negative Y-axis direction is positioned on the negative Y-axis direction side, that is, on the side where the second weight 232 is disposed with respect to the tip of the second projection 232A in the second weight 232 in the positive Y-axis direction.

In the case of such a configuration, the regions in which stresses occurring with displacements are focused and act are able to be positioned in the vicinity of both end portions of each of the first beam 241A, the third beams 241B and 241C, the second beam 242A, and the fourth beams 242B and 242C. The disposition of the piezoresistive elements in these regions enables effective detection of the acceleration.

Figure 7B:
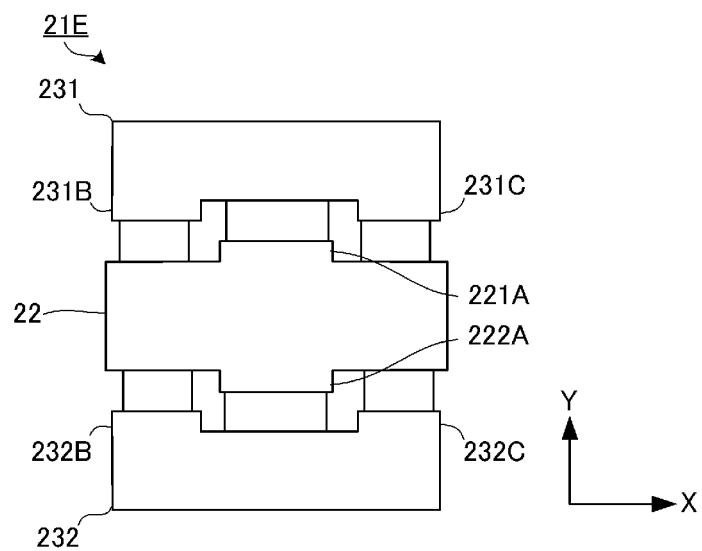

FIG. 7B is a plan view of an acceleration sensor 21E having a different arrangement of the structures of the projections and recesses of the facing surfaces of the support and the first weight and the second weight.

In the acceleration sensor 21E, the orientation of the structures of the projections and recesses is reversed to that in the configuration illustrated in FIG. 4, the surface of each of the first weight 231 and the second weight 232 facing the support 22 has a recess shape, and the surface of the support 22 facing each of the first weight 231 and the second weight 232 has a projecting shape. Accordingly, the first weight 231 includes first projections 231B and 231C. The second weight 232 includes second projections 232B and 232C. The support 22 includes a third projection 221A and a fourth projection 222A.

In this configuration, processing is able to be easily performed while adjusting the depth of the recess in each of the first weight 231 and the second weight 232. By finely adjusting the weight of each of the first weight 231 and the second weight 232, the structural resonant frequency and sensitivity are finely adjusted.

The configurations according to the second variations can also have various arrangements of the piezoresistive elements, as in the first variations. In such cases, because the stress occurring in each beam varies depending on the width of the beam in the X-axis direction, the width of each beam in the X-axis direction may preferably be adjusted and the arrangement of the piezoresistive elements may preferably be set, in accordance with required sensitivity.

Third Variations

Next, third variations of the acceleration sensor according to the first preferred embodiment are described. The acceleration sensors according to the third variations differ from the acceleration sensor illustrated in FIG. 4 in the configuration of the beams.

Figure 8A:
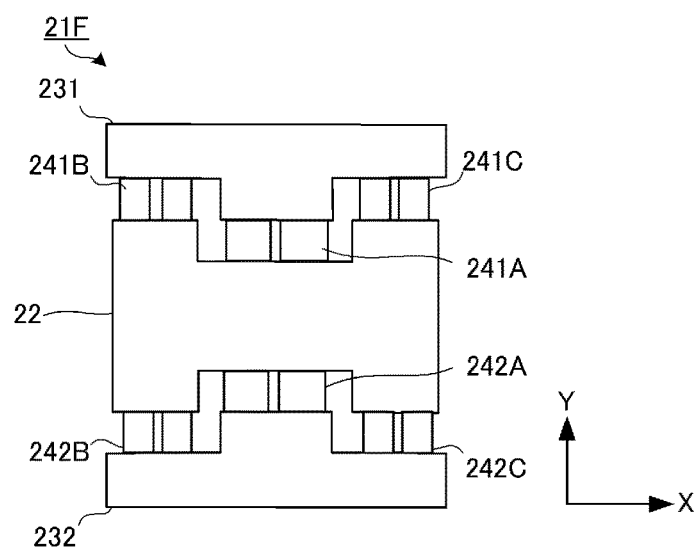
FIGS. 8A and 8B are plan views of third variations of the acceleration sensor according to the first preferred embodiment of the present invention.

FIG. 8A is a plan view of an acceleration sensor 21F using two divided beams in each beam. In the acceleration sensor 21F, each of the first beam 241A, the third beams 241B and 241C, the second beam 242A, and the fourth beams 242B and 242C includes two divided beams.

Figure 8B:
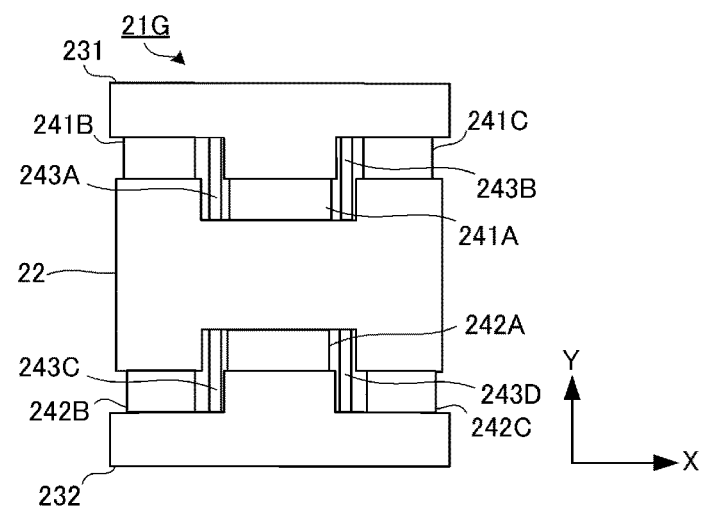

FIG. 8B is a plan view of an acceleration sensor 21G in which beams that remove routes allowing air to escape in response to vibrations are added. The acceleration sensor 21G includes a beam 243A between the first beam 241A and the third beam 241B, a beam 243B between the first beam 241A and the third beam 241C, a beam 243C between the second beam 242A and the fourth beam 242B, and a beam 243D between the second beam 242A and the fourth beam 242C.

In the configuration, the Q value in the vibration system is reduced by the effect of viscous drag of gas molecules in the space between the support 22 and each of the first weight 231 and the second weight 232, that is, the damping effect.

The configurations according to the third variations can also have various arrangements of the piezoresistive elements, as in the first variations. In such cases, because the relation between the width of each beam in the X-axis direction and a maximum stress occurring in the beam is not changed, the arrangement of the piezoresistive elements may preferably be set in accordance with the width of each beam in the X-axis direction.

The configurations according to the third variations may have various depths of the structures of the projections and recesses of the facing surfaces of the support and the first weight and the second weight and various arrangement thereof, as in the second variations.

The acceleration sensors according to various preferred embodiments of the present invention are specifically described above. The design of the specific configurations of the acceleration sensors may be changed. The operations and advantages described in the above preferred embodiments are merely examples of the most preferable operations and advantages occurring from the present invention are listed. The operations and advantages in the present invention are not limited to those described in the above preferred embodiments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acceleration sensor comprising:
   a first weight;
   a second weight symmetrical to the first weight about a plane;
   a support arranged between the first weight and the second weight;
   a first beam connecting the first weight and the support;
   a second beam symmetrical to the first beam about a plane and connecting the second weight and the support;

a third beam connecting the first weight and the support;
a fourth beam symmetrical to the third beam about a plane and connecting the second weight and the support; and
a piezoresistive element disposed on at least one of the first beam and the third beam and a piezoresistive element disposed on at least one of the second beam and the fourth beam; wherein
the first weight includes a first projection projecting toward the support;
the second weight includes a second projection projecting toward the support;
the support includes a third projection situated away from a location that faces the first projection and projecting toward the first weight and a fourth projection situated away from a location that faces the second projection and projecting toward the second weight;
the first beam includes a first end portion connected to the first projection and a second end portion connected to a portion of the support facing the first projection;
the second beam includes a first end portion connected to the second projection and a second end portion connected to a portion of the support facing the second projection;
the third beam includes a first end portion connected to the third projection and a second end portion connected to a portion of the first weight facing the third projection; and
the fourth beam includes a first end portion connected to the fourth projection and a second end portion connected to a portion of the second weight facing the fourth projection.

2. The acceleration sensor according to claim 1, wherein
a tip of the first projection is positioned on a side where the first weight is disposed with respect to a tip of the third projection; and
a tip of the second projection is positioned on a side where the second weight is disposed with respect to a tip of the fourth projection.

3. The acceleration sensor according to claim 1, wherein
a tip of the first projection is positioned on a side where the support is disposed with respect to a tip of the third projection; and
a tip of the second projection is positioned on a side where the support is disposed with respect to a tip of the fourth projection.

4. The acceleration sensor according to claim 1, wherein the support extends along a direction that faces the weight and along a direction perpendicular or substantially perpendicular to a direction in which the plurality of beams are arranged, and the support is fixed on an external structure at only one end portion of both end portions in the extending directions as a fixed end.

5. The acceleration sensor according to claim 4, wherein a size of the support in a cross section perpendicular or substantially perpendicular to the direction in which the support extends is locally reduced in a vicinity of the fixed end.

6. The acceleration sensor according to claim 1, wherein the acceleration sensor is configured to detect accelerations in two axial directions.

7. The acceleration sensor according to claim 1, wherein the acceleration sensor is a micro-electro-mechanical systems piezoresistive acceleration sensor that is micromachined on a silicon on insulator substrate.

8. The acceleration sensor according to claim 1, wherein the first weight and the second weight are symmetrical about a plane.

9. The acceleration sensor according to claim 1, wherein each of the first weight and the second weight has an oblong or substantially oblong shape with short sides parallel to one axis and long sides parallel or substantially parallel to another axis as seen in a plane.

10. The acceleration sensor according to claim 1, wherein the support has an H shape in which a center of a surface that faces the first weight is recessed in a direction opposite to the first weight and a center of a surface that faces the second weight is recessed in a direction opposite to the second weight.

* * * * *